United States Patent
Beems et al.

(10) Patent No.: US 7,349,072 B2
(45) Date of Patent: Mar. 25, 2008

(54) LITHOGRAPHIC APPARATUS AND DEVICE MANUFACTURING METHOD

(75) Inventors: Marcel Hendrikus Maria Beems, Veldhoven (NL); Engelbertus Antonius Fransiscus Van Der Pasch, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 111 days.

(21) Appl. No.: 10/960,788

(22) Filed: Oct. 8, 2004

(65) Prior Publication Data
US 2005/0110971 A1 May 26, 2005

(30) Foreign Application Priority Data
Oct. 9, 2003 (EP) .................. 03256381

(51) Int. Cl.
*G03B 27/54* (2006.01)
*G03B 27/42* (2006.01)
*G01B 11/02* (2006.01)

(52) U.S. Cl. ................. 355/67; 355/53; 356/498
(58) Field of Classification Search .......... 356/450, 356/491, 492, 493, 496, 498, 500; 355/53, 355/72, 75
See application file for complete search history.

(56) References Cited

U.S. PATENT DOCUMENTS 4,746,216 A * 5/1988 Sommargren ............ 356/485
5,398,112 A 3/1995 Ai et al.
2001/0035959 A1 11/2001 Hill
2003/0020921 A1 * 1/2003 Hill ........................... 356/493
2003/0038947 A1 * 2/2003 Hill ........................... 356/493
2003/0053074 A1 * 3/2003 Hill ........................... 356/500
2003/0197870 A1 * 10/2003 Bagwell et al. ............ 356/493

FOREIGN PATENT DOCUMENTS

| JP | 11-125503 | 11/1999 |
| JP | 2003-028609 | 1/2003 |
| WO | WO 03/019109 A1 | 3/2003 |

OTHER PUBLICATIONS

European Search Report completed Aug. 4, 2004.

\* cited by examiner

*Primary Examiner*—Henry Hung Nguyen
(74) *Attorney, Agent, or Firm*—Pillsbury Winthrop Shaw Pittman LLP

(57) ABSTRACT

Embodiments of the invention include an interferometer measurement system in which at least one reflective surface is arranged such that, in use, the beam path of interferometer radiation of the interferometer measurement system incident on the at least one reflective surface has an offset angle in the range of from 0.1 to 10 milliradians with respect to the normal to the at least one reflective surface. In that way, the effect of spurious radiation on the interferometer measurement system produced within the interferometer measurement system may be suppressed. In another embodiment, a parallel-sided plate is used in an interferometer measurement system to obtain a signal dependent on the angle of a beam of radiation reflected from a mirror. In that way, the flatness of the mirror can be mapped. One surface of the plate is a beam-splitter and the opposite surface of the plate is a reflector.

6 Claims, 4 Drawing Sheets

LITHOGRAPHIC APPARATUS AND DEVICE MANUFACTURING METHOD

PRIORITY INFORMATION

This application claims priority from European Patent Application No. 03256381.9, filed Oct. 9, 2003, the content of which is herein incorporated by reference in its entirety.

BACKGROUND

1. Field of the Invention

The present invention relates to lithographic projection apparatus and methods.

2. Description of Related Art

The term "patterning device" as here employed should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning device include:

1. A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

2. A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic devices. In both of the situations described hereabove, the patterning device can include one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required.

3. A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The illumination system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

In lithographic apparatus as described above, it is important to be able to determine the position of components, such as the substrate table and the support structure configured to support the patterning device, with great accuracy, such as of the order of nanometer or even sub-nanometer accuracy levels. Interferometer measuring systems have been used for this purpose, but have suffered from the problem that unwanted reflections and other imperfections in the optical components forming the interferometer lead to a deterioration in performance, such as a reduction in the modulation depth of the interference signal being measured, and even leading to cyclic (periodic) errors in the position measurement. Furthermore, uncertainty in the flatness profile of mirrors used in the interferometer measuring systems can lead to inaccuracy in the position determination.

SUMMARY

Embodiments of the invention include lithographic apparatus and methods. In an embodiment of the invention a lithographic apparatus includes an illumination system configured to condition a beam of radiation; a support structure configured to support a patterning device, the patterning device serving to pattern the beam of radiation according to a desired pattern; a substrate table configured to hold a substrate; a projection system configured to project the patterned beam of radiation onto a target portion of the substrate; and an interferometer measurement system configured to determine the position of an object within the apparatus, the object being provided with a reflective element, as part of the interferometer measurement system, for reflecting interferometer radiation, wherein at least one reflective surface of the interferometer measurement system is arranged such that, in use, the beam path of interferometer radiation of the interferometer measurement system incident on the at least one reflective surface has an offset angle in the range of from about 0.1 to 10 milliradians with respect to the normal to the at least one reflective surface, whereby the effect on the interferometer measurement system of spurious radiation produced within the interferometer measurement system is suppressed.

The spurious radiation, generated for example by undesired interfacial reflections, may still be incident on the detector of the interferometer system, but its effect on phase measurement, i.e. position determination, is suppressed because wavefronts of the spurious radiation are not parallel with the desired wavefronts, and therefore, after integration over the total interference area of the detector, the effect of sufficiently tilted spurious radiation is strongly reduced. This can improve the reliability of the position determination achieved using the apparatus, and hence improve the overlay accuracy.

In an embodiment of the invention, the interferometer measurement system includes a polarizing beam splitter, a corner cube, two quarter-wave plates and a reference reflector, all integrated into a monolithic block. Not only does the monolithic block reduce interfacial reflection and provide robustness, it may also provide a convenient way to arrange the necessary offset angle simply by positioning the block such that it has been rotationally displaced relative to the orientation of the block in a conventional interferometer measurement system.

In another embodiment of the invention, each desired interferometer radiation beam within the interferometer measurement system is reflected twice by each reflective surface. This has the advantage that any spurious beam which is only reflected once or an odd number of times will generally not be coincident with the desired output beams, because of the offset angle of the at least one reflective surface of the interferometer; a double reflection can compensate for the rotation.

In an embodiment of the invention, there is provided a lithographic projection apparatus including an interferometer measurement system configured to determine the angle of a beam of radiation reflected by a reflective element within the apparatus, so that the flatness of the reflective element can be derived. In at least one embodiment of the invention, the interferometer measurement system includes a plate having first and second parallel surfaces, the first surface including a beam-splitter and the second surface including a reflector; and a detector configured to obtain a signal resulting from the interference between two beam portions derived from the beam of radiation reflected by the reflective element and subsequently incident on the first surface, wherein the two beam portions include a first beam portion reflected by the beam-splitter of the first surface and a second beam portion reflected by the reflector of the second surface.

The use of the plate as defined above is advantageous because it is compact and less expensive than alternative arrangements for determining the beam angle and hence mirror flatness. Advantageously, the beam of radiation can be derived from another interferometer provided in the apparatus, for example, an interferometer configured to measure the position of an object. This avoids the need to provide a separate radiation source.

According to a further embodiment of the invention there is provided a method of manufacturing a device using a lithographic projection apparatus including an illumination system configured to provide a beam of radiation; a support structure configured to support a patterning device, the patterning device serving to pattern the beam of radiation according to a desired pattern; a substrate table configured to hold a substrate; and a projection system configured to project the patterned beam onto a target portion of the substrate, the method including providing a patterning device to the support structure; providing a substrate provided with a radiation-sensitive layer to the substrate table; and irradiating target portions of the substrate with the projection beam patterned by the patterning means, wherein providing an interferometer measurement system in which at least one reflective surface of the interferometer measurement system is arranged such that, in use, the beam path of interferometer radiation of the interferometer measurement system incident on the at least one reflective surface has an offset angle in the range of from 0.1 to 10 milliradians with respect to the normal to the at least one reflective surface, whereby the effect on the interferometer measurement system of spurious radiation produced within the interferometer measurement system is suppressed; and determining the position of an object within the apparatus, the object being provided with a reflective element, as part of the interferometer measurement system, for reflecting interferometer radiation.

According to a further embodiment of the invention, there is provided a method of manufacturing a device using a lithographic projection apparatus including an illumination system configured to provide a beam of radiation; a support structure configured to support a patterning device, the patterning device serving to pattern the beam of radiation according to a desired pattern; a substrate table configured to hold a substrate; and a projection system configured to project the patterned beam onto a target portion of the substrate, the method including providing a patterning device to the support structure; providing a substrate provided with a radiation-sensitive layer to the substrate table; and irradiating target portions of the substrate with the projection beam patterned by the patterning device, wherein the method further includes providing an interferometer measurement system which includes: a plate having first and second parallel surfaces, the first surface including a beam-splitter and the second surface comprising a reflector; and a detector configured to obtain a signal resulting from the interference between two beam portions derived from a beam of radiation reflected by a reflective element and subsequently incident on the first surface, wherein the two beam portions include a first beam portion reflected by the beam-splitter of the first surface and a second beam portion reflected by the reflector of the second surface, the interference depending on the angle of the beam incident on the plate; and determining the angle of the beam of radiation reflected by the reflective element within the apparatus, based on the signal obtained by the detector, and thereby deriving the flatness of the reflective element.

A device manufacturing method in accordance with an embodiment of the invention includes projecting a patterned beam of radiation onto a target portion of a substrate; and determining a position of an object with an interferometer measurement system, the object including a reflective portion configured to reflect a radiation, wherein the interferometer measurement system includes a reflective surface arranged such that the beam path of interferometer radiation of the interferometer measurement system incident on the reflective surface has an offset angle in the range of from about 0.1 to 10 milliradians with respect to the normal to the reflective surface so as to suppress the effect of spurious radiation on the interferometer measurement system produced within the interferometer measurement system.

An interferometer measurement system configured to determine a position of an object, in accordance with an embodiment of the invention includes a reflective surface arranged such that a beam path of interferometer radiation of the interferometer measurement system incident on the reflective surface has an offset angle in the range of from about 0.1 to 10 milliradians with respect to the normal to the reflective surface so as to suppress the effect of spurious radiation on the interferometer measurement system produced within the interferometer measurement system.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
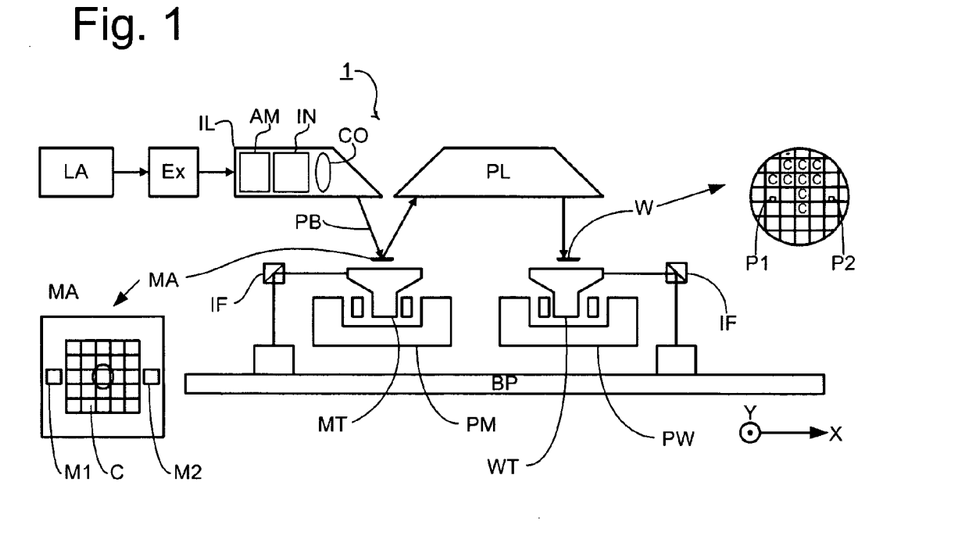
FIG. 1 depicts a lithographic projection apparatus according to an embodiment of the invention.

FIG. 1 schematically depicts a lithographic projection apparatus 1 according to an embodiment of the invention. The apparatus includes an illumination system Ex, IL, configured to supply a beam PB of radiation (e.g., EUV radiation), and a radiation source LA. The apparatus also includes a first object table (mask table) MT provided with a mask holder configured to hold a mask MA (e.g., a reticle), and connected to a first positioning device configured to accurately position the mask with respect to the projection system ("lens"), item PL, with the aid of an interferometer measurement device. The apparatus further includes a second object table (substrate table) WT provided with a substrate holder configured to hold a substrate W (e.g., a resist-coated silicon wafer), and connected to a second positioning device configured to accurately position the substrate with respect to the projection system ("lens"), item PL, the a projection system ("lens") PL (e.g., mirror group) being configured to image an irradiated portion of the mask MA onto a target portion C (e.g., including one or more dies) of the substrate W.

As here depicted, the apparatus is of a reflective type (e.g. has a reflective mask). However, in general, it may also be of a transmissive type, for example (e.g. with a transmissive mask). Alternatively, the apparatus may employ another kind of patterning device, such as a programmable mirror array of a type as referred to above.

The source LA (e.g. a laser-produced or discharge plasma source) produces a beam of radiation. This beam is fed into an illumination system (illuminator) IL, either directly or after having traversed conditioning devices, such as a beam expander Ex, for example. The illuminator IL may include an adjusting device AM configured to set the outer and/or inner radial extent (commonly referred to as σ-outer and σ-inner, respectively) of the intensity distribution in the beam. In addition, it will generally include various other components, such as an integrator IN and a condenser CO.

In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning device (and interferometric measuring device IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

Step mode: the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

Scan mode: essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

To assist understanding of the present embodiment of the invention, a previous arrangement of an interferometer system will be described with reference to FIGS. 2 and 3.

Figure 2:
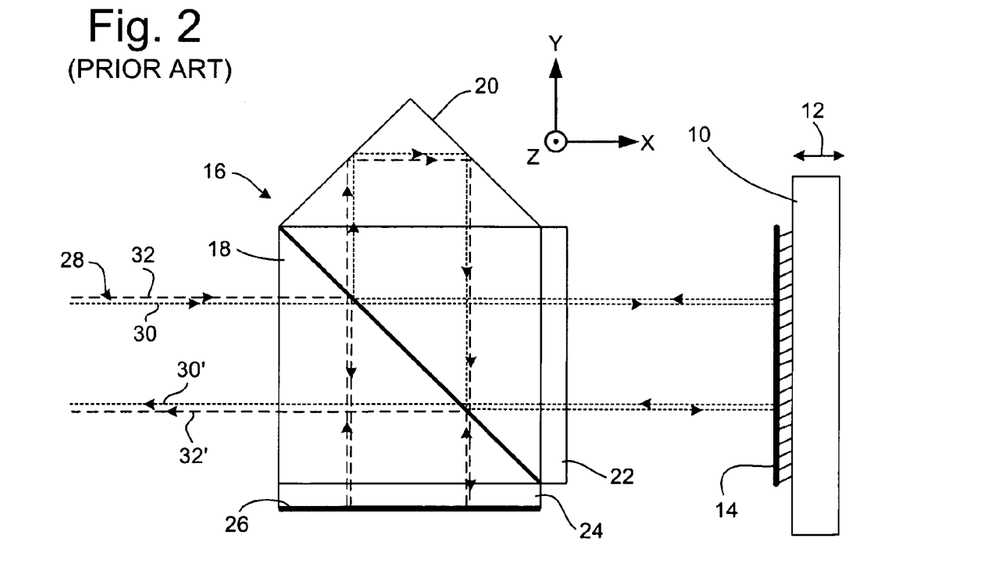
FIGS. 2 and 3 depict an arrangement of a conventional interferometer measurement system.
Figure 3:
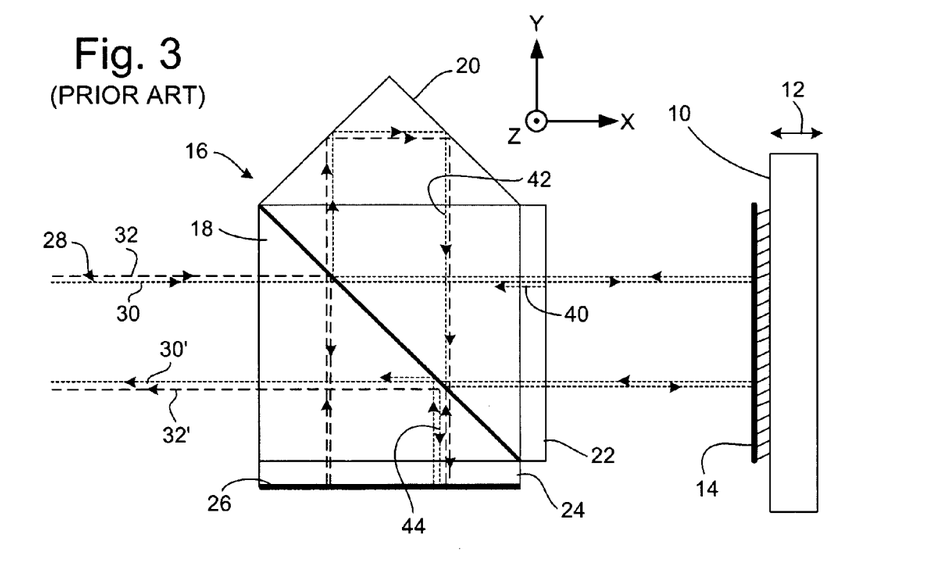

FIG. 2 shows an object 10 in the lithographic apparatus, such as a substrate table or mask table. The object 10 is moveable as indicated by the arrow 12, and it is the position of this object 10 which is to be determined. The object 10 is provided with a reflective element 14, such as a mirror or reflective surface. The system includes a monolithic interferometer structure 16 which includes a polarizing beam splitter 18, a corner cube 20, two quarter-wave plates 22, 24 and a reflective element 26, such as a mirror or a reflective coating on the quarter-wave plate 24, and which will be referred to as the reference reflector 26 hereafter.

The interferometer system operates as follows. It is a heterodyne interferometer and the input light 28 include two beams 30 and 32, which differ in frequency by, for example, 2 MHz. The two beams 30, 32 are also linearly polarized, orthogonally with respect to each other, in the plane and perpendicular to the plane of FIG. 2 (i.e. polarized along the Y and Z directions of the axis system shown in FIG. 2). Upon entering the polarizing beam splitter, one of the beams 30, shown by the dotted line, has a polarization such that it passes through undeviated. This beam then passes through the quarter-wave plate 22, is reflected off the reflective element 14 and returns back through the quarter-wave plate 22 and enters the polarizing beam splitter 18 again. The effect of the double-pass through the quarter-wave plate 22 and the reflection off the reflective element 14 mean that the plane of polarization of this beam has been rotated, such that it is now internally reflected within the polarizing beam splitter 18 and is diverted to the corner cube 20. In the corner cube 20 the beam is reflected back into the polarizing beam splitter 18 in which it is again internally reflected back towards the reflective element 14 on the moveable object 10. This beam again passes twice through the quarter-wave plate 22 with an intermediate reflection off the reflective element 14, which rotates its plane of polarization such that it is now transmitted through the beam splitter 18 and emerges as output beam 30'.

The other input beam 32 follows a path shown schematically by the dashed line. On first pass through the beam splitter 18, it is reflected downwards because it is of orthogonal polarization to the first input beam 30. The beam is then reflected off the reference reflector 26, passing twice through the quarter-wave plate 24, then passes undeviated through the beam splitter 18, is sent back by the corner cube 20 and is again reflected off the reference reflector 26 before being reflected in the beam splitter 18 and exiting as output beam 32'.

The two output beam 30' and 32' are still orthogonal linearly polarized beams, but can be made to interfere by use of an analyzing polarizer (not shown) with polarization direction rotated 45° with respect to both beams 30' and 32'. The resulting light output from the polarizer can be detected and converted to an electrical signal. When the object 10 is stationary, this output signal oscillates at a frequency of 2 MHz, for example, and ideally has a large modulation depth. When the object 10 is moved, this introduces a change in the path difference between the two polarized beams, and therefore the phase of the modulated output signal shifts. By detecting the phase shift of the output signal the change in position of the object can be determined.

The monolithic interferometer structure 16 as shown in FIG. 2 is advantageous because the components are connected using index-matching glue which reduces the number of glass-air (or vacuum) interfaces at which unwanted reflection can occur. However, there can still be problems, such as illustrated in FIG. 3. Arrow 40 indicates a portion of the beam 30 which is reflected at the surface of the quarter-wave plate 22. Even if anti-reflection coatings are provided at all the interfaces, a significant amount of reflection, such as 1% can still occur. This stray beam 40 then re-enters the interferometer and eventually emerges mixed in the output beams 30' and 32', but, of course, it has not traversed one of the paths to and from the reflective element 14 on the object 10, so it has a phase-error with respect to the intended output beam 30' which can result in errors in the position determination.

Furthermore, the corner cube 20 may introduce an unwanted rotation of the plain of polarization of the beams and that the polarizing beam splitter is not 100% efficient at separating the orthogonal polarization. Thus, as shown in FIG. 3, the dotted beam 42 exiting the corner cube 20 may not be perfectly reflected by the polarizing beam splitter 18, either because of limitations of the beam splitter 18 or because its polarization has been altered by the corner cube 20. This results in leakage of some of the beam, as shown by the arrow 44. This leaked beam is then reflected and exits with the output beams 30', 32', but again it has not undergone one of the round trips to the reflective element 14 on the object 10. Similar problems can occur at other interfaces and with the other polarized beam (dashed line).

Figure 4:
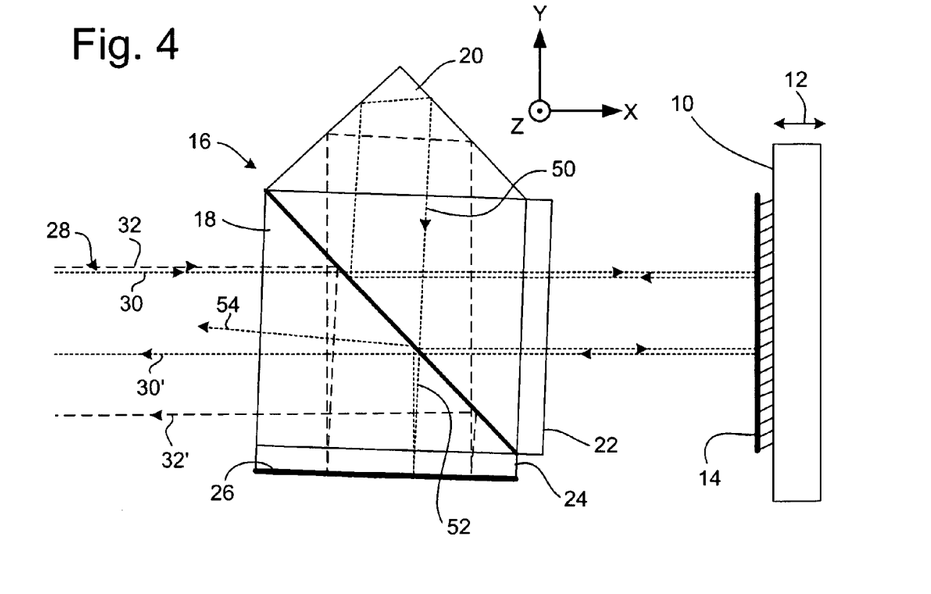
FIG. 4 depicts an arrangement of an interferometer measurement system according to an embodiment of the invention in which the monolithic interferometer block has an offset angle.

FIG. 4 shows an embodiment according to the present invention in which a monolithic interferometer structure 16 has been rotationally offset through a small angle about an axis, in this case the Z-axis. The axis system shown is just for explanation of some embodiments of the invention, and need not necessarily correspond with any particular axis system within the lithographic apparatus of FIG. 1, but does indicate a set of principal axes of the interferometer system, i.e. parallel and perpendicular to the input and output beams. In practice, the orientation of the monolithic interferometer structure 16 is preset at the factory and may be fixed at a constant angle, in an embodiment of the invention, though it is envisaged that the offset angle might be variable. Clearly, the normal configuration of the beam-splitter is to have plane faces parallel and perpendicular to the principal axes and an interface at 45° at which partial reflection (i.e. beam-splitting) occurs, and so the angular offset of this component can be determined relative to that conventional state. In the embodiments described herein, the input beam 28 is parallel to the X-axis. The resulting beam paths are shown schematically in FIG. 4. The offset angle and the displacement of the beams have been exaggerated for clarity. To simplify the illustration, the refraction of the beams on entering and exiting the interferometer 16 have been neglected, but would, of course, depend on the difference in refractive index between the surroundings and the material of the interferometer structure 16; however, a beam entering a parallel-sided block will always leave in a direction parallel to its input direction, although it may be laterally displaced.

The interferometer still works because of the property of the corner cube 20 which means that a beam which enters the corner cube 20 is output in a direction parallel, but opposite, to the input direction, and because each beam (dotted or dashed) makes two reflections in opposite senses, either within the beam splitter 18 and/or the reference reflector 26, which restores the final output beams to being parallel to one another, even though the interferometer 16 has been rotated. The centers of the output beams 30', 32' are shifted such that they are offset relative to each other, but typically the amount of offset will be much less than the beam diameter, such that strong interference can still be obtained.

The effect of this embodiment will be apparent when one considers any single unwanted reflection at an interface of the interferometer 16, such as at the surface of the quarter-wave plate 22. Because this interface is no longer perpendicular to the beam propagation direction, the stray reflection will not be parallel to the desired beams, and so will not to cause a phase error in the detector measurement. Similarly, leakage at the beam splitter 18 will not result in a leaked beam which causes measurement errors; for example consider the beam shown by the arrow 50 entering the beam splitter 18 and which should be reflected towards the reflective element 14. Any leakage of this beam, shown by dotted line 52, will be reflected off the reference reflector 26 only once and so will ultimately exit the system as shown by arrow 54 non-parallel to the output beams 30', 32' and so is excluded from the detected output signal because the wavefronts of the spurious beam 54 are not parallel to the wavefronts of the desired output beams 30', 32', and so their effect is strongly reduced when integrated over the total interference area of the detector.

In this embodiment of the invention, the leakage beams have a wavefront which is tilted relative to the desired output beams, and the angle of this tilted wavefront is at least two times the wavelength divided by the beam diameter. The beam diameter can be taken as the diameter at which the intensity as fallen by $e^{-2}$ of that at the beam center. If this criterion is fulfilled, then the influence of the leakage beams on the phase of the output signal is negligible. In fact, this means that the rotation of the interferometer structure 16 will be of the order of a milliradian or typically in the range of from 0.25 to 1 milliradians. The wavelength of the interferometer radiation is typically 633 nm and the beam diameter might be approximately from 2.5 to 10 mm.

In another embodiment of the invention, the interferometer is rotated about the Y-axis instead of, or as well as, about the Z-axis to achieve the same effect.

Figure 5:
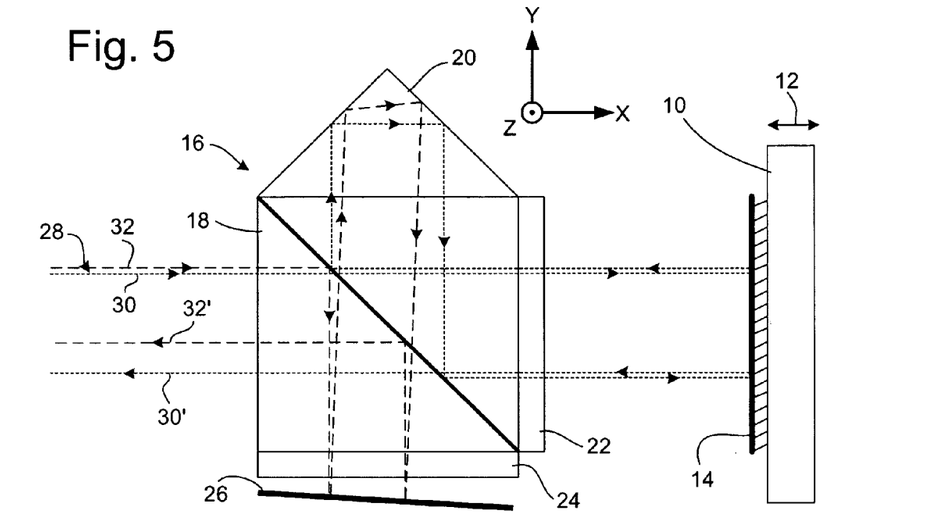
FIGS. 5 and 6 depict arrangements of an interferometer measurement system according to another embodiment of the invention in which the reference reflector has an offset angle.

FIG. 5 illustrates an embodiment of the invention, which is identical to FIG. 2 except that the reference reflector 26 is now angled with respect to the monolithic interferometer structure 16. Again, the fact that the corner cube 20 returns a beam parallel to its input direction, and that the polarized beam shown as a dash line is reflected twice off the tilted reference reflector 26, means that the desired output beams 30' and 32' remain parallel, but any stray or leakage beam which is reflected only once or more than twice off the tilted reference reflector 26 will not exit parallel to the output beams and so can be excluded from introducing phase errors in the output signal.

In an embodiment of the invention, the reference reflector 26 is tilted by rotation about the Z-axis and/or the X-axis.

Figure 6:
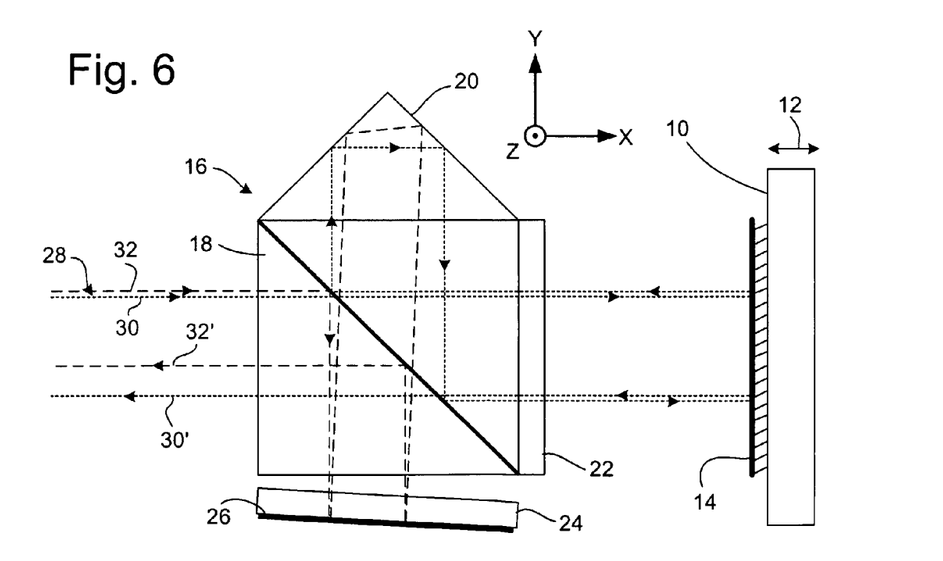

Another embodiment of the invention is illustrated in FIG. 6 whereby the quarter-wave plate 24 is also tilted. In the case of either FIG. 5 or FIG. 6, a non-birefringent wedge of material can be included to accommodate the tilt, such that the interferometer 16 remains a monolithic block.

In a further embodiment of the invention, the reflective element 14 is tilted about either the Z-axis or Y-axis (not illustrated). However, this may result in a lateral displacement of the output beams which depends on the position of the object 10, and therefore may be less desirable.

For any of the preceding embodiments of the invention, the interferometer need not be monolithic, for example an interferometer with separate quarter-wave plates and/or a separate corner cube could be used. The number of possible undesired reflecting surfaces would be increased, but it is still a feasible design.

The following embodiment of the invention can be used in conjunction with the previously described embodiments, or can be used separately.

Figure 7:
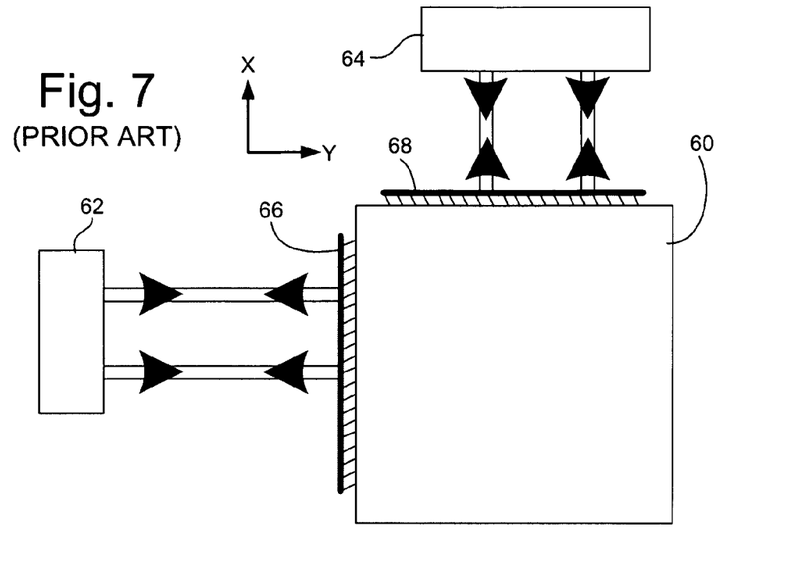
FIG. 7 depicts an arrangement of a conventional interferometer measurement system.

When using an interferometer to determine the position of an object accurately, it can be important to measure the non-flatness of the mirror on the object. FIG. 7 illustrates a conventional arrangement in which the object whose position is to be determined is a wafer stage 60. Two interferometer systems 62, 64 are provided, one for determining the position in each of the X and Y directions. Each interferometer system 62, 64 actually includes two interferometers and measures the position of the wafer stage 60 at two different places in each of the X and Y directions, as shown by the arrows indicating interferometer beams being transmitted to and reflected from the respective mirrors 66, 68 at two different places. This arrangement also enables rotation of the wafer stage 60 to be measured.

To determine the flatness of each of the mirrors 66 and 68, the wafer stage 60 is scanned firstly keeping the X position constant and then keeping the Y position constant such that a map of the pattern of the flatness of each mirror can be built up based on the slight differences in distance measured by the pairs of interferometers in the interferometer systems 62, 64.

An alternative proposal is to measure the flatness more directly by determining the angle at which a light beam is reflected from the mirror at a particular location. Some ways of achieving this have been proposed, but had the disadvantages of being bulky, so difficult to accommodate within the lithography apparatus, and of involving complex and expensive optical components.

Figures 8A, 8B:
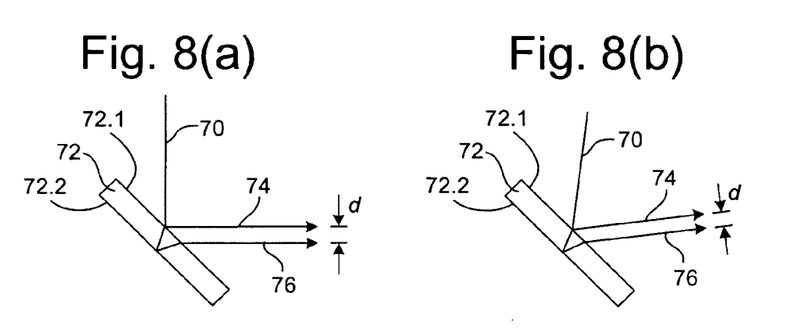
FIGS. 8(a) and 8(b) illustrate the operation of the parallel-sided plate of the interferometer measurement system of a further embodiment of the invention.

FIGS. 8(*a*) and 8(*b*) illustrate an embodiment of the invention for measuring the angle of a beam, and hence the flatness at a particular location of a mirror. A beam is shone onto the interferometer mirror and a beam 70 is reflected off the mirror at a particular angle. The reflected beam 70 is directed to a parallel-sided plate 72, for example made of glass or silica. The front surface 72.1 of the plate 72 includes a beam-splitter, such as a polarizing beam splitter and the rear surface 72.2 of the plate 72 includes a mirror (coatings for the surfaces of the plate 72 to endow it with these properties are well known in the art). Consequently, a portion of the beam 74 is reflected off the front surface 72.1 of the plate 72. The remaining portion of the beam, which is not reflected by the beam splitter on the front surface 72.1 of the plate 72, is reflected by the mirror rear surface 72.2 of the plate 72 and emerges as beam portion 76. A pattern of interference is produced between the beam portion 74 and beam portion 76. If the angle of the beam 70 changes, then the geometry is altered, as can be seen by comparing FIGS. 8(*a*) and 8(*b*), and consequently the interference changes. Two effects are in operation here: firstly, as the angle of the beam 70 changes, the separation d between the centers of the beam portions 74 and 76 changes such that they overlap to a different extent; and secondly, the phase difference between the beam portions 74 and 76 changes due to the change in path difference between them. It should be noted in FIGS. 8(*a*) and 8(*b*), that the beam lines only indicate the center of the respective beams and beam portions 70, 74 and 76; in practice, the beams are relatively broad, for example of similar breadth to the thickness of the plate 72; consequently there is considerable overlap between the interfering beam portions 74 and 76. In an embodiment of the invention, the beam 70 has a breadth of 9 mm and the thickness of the parallel-sided plate 72 is approximately 8 mm. The change in interference between beam portions 74 and 76 enables variation in the angle of the surface of the interferometer mirror, such as mirrors 66, 68 to be determined with an angular accuracy of the order of micro-radians.

Figure 9:
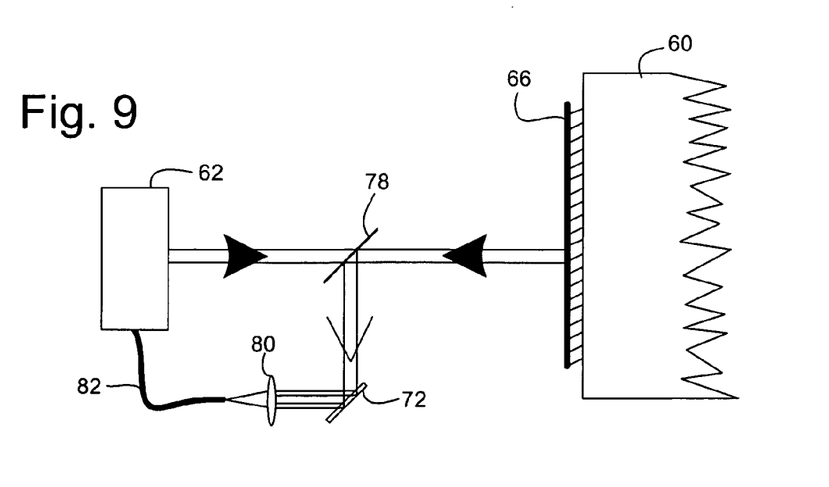
FIG. 9 depicts the parallel-sided plate of FIGS. 8(a) and 8(b) in use in an angular-dependent interferometer measurement system in a lithographic projection apparatus in accordance with an embodiment of the invention.

FIG. 9 illustrates a particular way of implementing this invention by building it into one of the normal distance-measuring interferometers already provided. A beam splitter 78 splits off a small part of each interferometer beam and directs it towards parallel-sided plate 72. The light reflected from the plate 72 is focused by a lens 80 and coupled into an optical fiber 82. The amplitude of the light in the optical fiber 82 is measured by a detector in the interferometer system 62, and the measured amplitude gives the desired information about the angle of the light incident on the plate 72, and therefore the angle of the mirror 66 at a particular location can be determined and thus the flatness of the mirror 66 can be mapped. In other words, the local angle of the mirror 66 is measured, and the flatness can be derived from the variation in local angle as a function of position on the mirror.

The angular-measurement interferometer of this embodiment of the invention may be provided in only one or in more than one of the interferometers of FIG. 7 or elsewhere in the lithographic projection apparatus. Alternatively, of course, the radiation for the angular-measurement interferometer need not come from one of the existing distance-measurement interferometers, and instead may have a dedicated radiation source.

Although the above description has referred to an arrangement for measuring the wafer stage 60, all of the embodiments of the invention can be employed in a variety of interferometer measurement systems in a lithographic projection apparatus, for example: for the precision alignment of a mask relevant to a substrate; for the precise leveling of a substrate and/or mask relative to the projection beam, as directed onto a particular target area of the substrate; and for the accurate determination of the position, velocity and/or acceleration of the substrate and/or mask stages.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

While specific embodiments of the invention have been described above, it will be appreciated that the invention may be practiced otherwise than as described. The description is not intended to limit the invention.

What is claimed is:

1. A lithographic projection apparatus comprising:
   an illumination system configured to condition a beam of radiation;
   a support structure configured to support a patterning device, the patterning device serving to pattern the beam of radiation according to a desired pattern;
   a substrate table configured to hold a substrate;
   a projection system configured to project the patterned beam of radiation onto a target portion of the substrate; and
   an interferometer measurement system configured to determine a reflection angle of a beam of interferometer radiation reflected by a reflective portion of an object so as to determine a flatness of said reflective portion, the interferometer measurement system including:
   a plate having first and second parallel surfaces, the first surface comprising a beam-splitter and the second surface comprising a reflector; and
   a detector configured to detect a signal resulting from the interference between two beam portions derived from said beam of interferometer radiation reflected by said reflective portion and subsequently incident on said first surface, wherein the two beam portions include a first beam portion reflected by the beam-splitter of the first surface and a second beam portion reflected by the reflector of the second surface.

2. The apparatus of claim 1, further comprising an optical fiber configured to convey radiation to the detector and a lens configured to couple the first and second beam portions from the plate to the optical fiber.

3. The apparatus of claim 1, wherein said interferometer radiation reflected by the reflective portion is output by another interferometer measurement system of the apparatus, said apparatus further comprising a beam-splitter to split the beam of interferometer radiation and direct it towards the plate.

4. The apparatus of claim 1, wherein said object is the substrate table of the support structure.

5. A device manufacturing method comprising:
projecting a patterned beam of radiation onto a target portion of a substrate; and
determining a flatness of a reflective element with an interferometer measurement system,
wherein said interferometer measurement system includes:
a plate having first and second parallel surfaces, the first surface comprising a beam-splitter and the second surface comprising a reflector; and
a detector configured to detect a signal resulting from the interference between two beam portions derived from a beam of radiation reflected by the reflective element and subsequently incident on said first surface, wherein the two beam portions comprise a first beam portion reflected by the beam-splitter of the first surface and a second beam portion reflected by the reflector of the second surface, the interference depending on the angle of the beam incident on the plate.

6. The method of claim 5, wherein said reflective element is a surface of a substrate table configured to hold the substrate or a support structure configured to hold a patterning device.

* * * * *